US008994158B2

(12) United States Patent
Kim et al.

(10) Patent No.: US 8,994,158 B2
(45) Date of Patent: Mar. 31, 2015

(54) SEMICONDUCTOR PACKAGES HAVING LEAD FRAMES

(75) Inventors: Do-Hyun Kim, Incheon (KR); Won-young Kim, Asan-si (KR)

(73) Assignee: Samsung Electronics Co., Ltd. (KR)

( * ) Notice: Subject to any disclaimer, the term of this patent is extended or adjusted under 35 U.S.C. 154(b) by 276 days.

(21) Appl. No.: 13/277,799

(22) Filed: Oct. 20, 2011

(65) Prior Publication Data
US 2012/0175756 A1    Jul. 12, 2012

(30) Foreign Application Priority Data

Jan. 11, 2011    (KR) .................. 10-2011-0002806

(51) Int. Cl.
*H01L 23/495* (2006.01)
*H01L 23/00* (2006.01)

(52) U.S. Cl.
CPC ...... *H01L 23/49575* (2013.01); *H01L 23/4951* (2013.01); *H01L 23/49558* (2013.01); *H01L 23/49541* (2013.01); *H01L 2224/32245* (2013.01); *H01L 2224/48091* (2013.01); *H01L 2224/48247* (2013.01); *H01L 2224/73265* (2013.01); *H01L 2225/06562* (2013.01); *H01L 2225/06568* (2013.01); *H01L 24/48* (2013.01)
USPC ........... 257/676; 257/666; 257/667; 257/672; 257/673; 257/690; 257/692; 257/734; 257/735

(58) Field of Classification Search
CPC ........ H01L 23/495; H01L 33/00; H01L 23/52
USPC ......... 257/676, 666, 667, 672, 673, 690, 692, 257/734, 735
See application file for complete search history.

(56) References Cited

U.S. PATENT DOCUMENTS

| 5,969,416 A * | 10/1999 | Kim ............................ 257/692 |
| 6,036,173 A * | 3/2000 | Neu et al. ..................... 257/668 |
| 8,237,249 B2 * | 8/2012 | Shen ............................ 257/668 |
| 2003/0080341 A1 * | 5/2003 | Sakano et al. ................ 257/79 |
| 2009/0072367 A1 * | 3/2009 | Poddar et al. ................ 257/676 |

FOREIGN PATENT DOCUMENTS

| JP | 7169780 | 7/1995 |
| KR | 20030041530 | 5/2003 |
| KR | 20070028067 | 3/2007 |

* cited by examiner

*Primary Examiner* — Chuong A Luu
(74) *Attorney, Agent, or Firm* — Onello & Mello, LLP

(57) ABSTRACT

Semiconductor packages having lead frames include a lead frame, which supports a semiconductor chip and is electrically connected to the semiconductor chip by bonding wires, and a molding layer encapsulating the semiconductor chip. The lead frame includes first lead frames extending in a first direction and second lead frames extending in a second direction. The first lead frames may run across the semiconductor chip and support the semiconductor chip and the second lead frames may run across the bottom surface of the semiconductor chip.

20 Claims, 14 Drawing Sheets

SEMICONDUCTOR PACKAGES HAVING LEAD FRAMES

CROSS-REFERENCE TO RELATED APPLICATIONS

This U.S. non-provisional patent application claims priority under 35 U.S.C. §119 to Korean Patent Application No. 10-2011-0002806, filed on Jan. 11, 2011, in the Korean Intellectual Property Office, the entire contents of which are incorporated herein by reference.

BACKGROUND OF THE INVENTION

The inventive concepts relate generally to semiconductor devices, and, more particularly, to semiconductor packages having lead frames.

In the semiconductor industry, integrated circuit packaging technology has been developed to satisfy requirements for small-form-factor devices and high package reliability. For instance, package techniques capable of realizing a chip-size package are actively being developed to satisfy the requirement for small-form-factor devices. In addition, package techniques capable of promoting efficiency in a package process and improving mechanical and electrical reliability of a packaged product have attracted considerable attention in terms of the high package reliability.

SUMMARY

The inventive concepts provide a semiconductor package with a semiconductor chip stably mounted thereon. Some embodiments of the inventive concepts provide a semiconductor package capable of providing a stable wire bonding structure. Some embodiments of the inventive concepts provide a semiconductor package capable of preventing a molding failure.

According to example embodiments of the inventive concepts, a semiconductor package is configured to include a bilateral inner lead frame structure capable of supporting the semiconductor chip at both sides thereof. In some embodiments of the inventive concepts, bondability of a bonding wire can be increased due to the bilateral inner lead frame structure. In some embodiments of the inventive concepts, it is possible to reduce a process failure during a molding process.

According to an aspect of the inventive concepts, a semiconductor package may include a lead frame, which supports a semiconductor chip and is electrically connected to the semiconductor chip by bonding wires, and a molding layer encapsulating the semiconductor chip. The lead frame may include a plurality of first lead frames extending from a first side to a second side of the semiconductor chip to run across a bottom surface of the semiconductor chip and support the semiconductor chip and a plurality of second lead frames extending from the second side to the first side of the semiconductor chip to run across the bottom surface of the semiconductor chip.

In some embodiments, the first lead frame may include a first inner lead running across the bottom surface of the semiconductor chip and including a first end portion extending in a first direction beyond a boundary of the semiconductor chip, and a first outer lead extending from the first inner lead in a second direction beyond the molding layer.

In some embodiments, the second lead frame may include a second inner lead extending from the second side to the first side of the semiconductor chip and supporting the bottom surface of the semiconductor chip and a second outer lead extending from the second inner lead in the first direction beyond the molding layer. The second inner lead may be configured not to protrude beyond a boundary on the first side of the semiconductor chip.

In some embodiments, the semiconductor chip may include a plurality of edge pads arranged on a top surface of the semiconductor chip on the second side, the bonding wires may be configured to electrically connect the first and second inner leads with the edge pads at the second side of the semiconductor chip, and the bonding wires may be connected to the first end portions of the first inner leads.

In some embodiments, the second lead frame may include a second inner lead running across the bottom surface of the semiconductor chip and including a second end portion extending in the second direction beyond a boundary of the semiconductor chip. The second lead frame may further include a second outer lead extending from the second inner lead in the first direction beyond the molding layer.

In some embodiments, the semiconductor chip may include a plurality of first edge pads arranged on a top surface of the semiconductor chip on the first side and a plurality of second edge pads arranged on a top surface of the semiconductor chip on the second side. The bonding wires may be configured to connect electrically the first inner leads with the first edge pads at the first side of the semiconductor chip and to connect electrically the second inner leads with the second edge pads at the second side of the semiconductor chip.

In some embodiments, the semiconductor chip may include a plurality of first edge pads arranged on a top surface of the semiconductor chip on the first side and a plurality of second edge pads arranged on a top surface of the semiconductor chip on the second side, and the bonding wires may be configured to connect electrically the second end portions of the second inner leads with the first edge pads at the first side of the semiconductor chip and to connect electrically the first end portions of the first inner leads with the second edge pads at the second side of the semiconductor chip.

In some embodiments, the package may further include a plurality of third lead frames disposed adjacent to a boundary on the first side of the semiconductor chip and interposed between the first lead frames and a plurality of fourth lead frames disposed adjacent to a boundary on the second side of the semiconductor chip and interposed between the second lead frames.

In some embodiments, the third lead frame may include a third inner lead spaced apart from the second end portion of the second inner lead and a third outer lead extending from the third inner lead in the second direction beyond the molding layer.

In some embodiments, the fourth lead frame may include a fourth inner lead spaced apart from the first end portion of the first inner lead and a fourth outer lead extending from the fourth inner lead in the first direction beyond the molding layer.

In some embodiments, the semiconductor chip may include a first edge pad disposed on a top surface of the semiconductor chip on the first side and second edge pads disposed on a top surface of the semiconductor chip on the second side, and the bonding wires may be configured to connect electrically the first and third inner leads with the first edge pads at a first side of the semiconductor chip and to connect electrically the second and fourth inner leads with the second edge pads at a second side of the semiconductor chip.

In some embodiments, the package may further include a first fixing tape adhered on the first lead frames to fasten the first lead frame and a second fixing tape adhered on the second lead frames to fasten the second lead frames.

In some embodiments, each of the first and second lead frames may include an incline surface or a flat surface, the inclined surface being downhill sloped toward an inside of the molding layer.

According to another aspect of the inventive concepts, a semiconductor package may include a semiconductor chip including a plurality of edge pads disposed on a top surface of the semiconductor chip on a first side thereof, a molding layer encapsulating the semiconductor chip, a plurality of first lead frames including first inner leads and first outer leads, each of the first inner leads extending from a second side to the first side of the semiconductor chip to run across a bottom surface of the semiconductor chip and including a first end portion protruding from a boundary on the first side of the semiconductor chip, and each of the first outer leads extending from the first inner lead in a first direction beyond the molding layer, a plurality of second lead frames including second inner leads and second outer leads, each of the second inner leads extending from the first side to the second side of the semiconductor chip to support the bottom surface of the semiconductor chip, and each of the second outer leads extending from the second inner lead in a second direction beyond the molding layer, and a plurality of bonding wires electrically connecting the first and second inner leads with the edge pads at the first side of the semiconductor chip.

In some embodiments, the second inner lead may be configured to extend from the first side to the second side of the semiconductor chip but not to protrude beyond a boundary on the second side of the semiconductor chip.

In some embodiments, the second inner lead may be configured to run across the bottom surface of the semiconductor chip and may include a second end portion protruding beyond a boundary on the second side of the semiconductor chip.

In another aspect of the inventive concepts, a semiconductor package includes a semiconductor chip having a first side and a second side, a molding layer encapsulating the semiconductor chip, a plurality of first lead frames extending from a bottom surface of the semiconductor chip in a first direction, and a plurality of second lead frames extending from the bottom surface of the semiconductor chip in a second direction opposite the first direction. The plurality of first lead frames run across the bottom surface of the semiconductor chip to support the semiconductor chip on the first and second sides, and the plurality of second lead frames support the semiconductor chip on the second side.

In some embodiments, the first lead frame may include a first inner lead running across the bottom surface of the semiconductor chip and a first outer lead extending from the first inner lead in the first direction beyond the molding layer.

In some embodiments, the second lead frame may include a second inner lead running across the bottom surface of the semiconductor chip and a second outer lead extending from the second inner lead in the second direction beyond the molding layer.

In some embodiments, the first inner lead may include a first end portion extending in the second direction beyond a boundary of the semiconductor chip. In some embodiments, the second inner lead may include second end portion extending in the first direction beyond a boundary of the semiconductor chip.

BRIEF DESCRIPTION OF THE DRAWINGS

The foregoing and other features and advantages of the inventive concepts will be apparent from the detailed description of preferred embodiments of the inventive concepts contained herein, as illustrated in the accompanying drawings, in which like reference characters refer to the same parts or elements throughout the different views. The drawings are not necessarily to scale, emphasis instead being placed upon illustrating the principles of the inventive concepts. In the drawings, the thickness of layers and regions may be exaggerated for clarity.

DETAILED DESCRIPTION

Figure 1A:
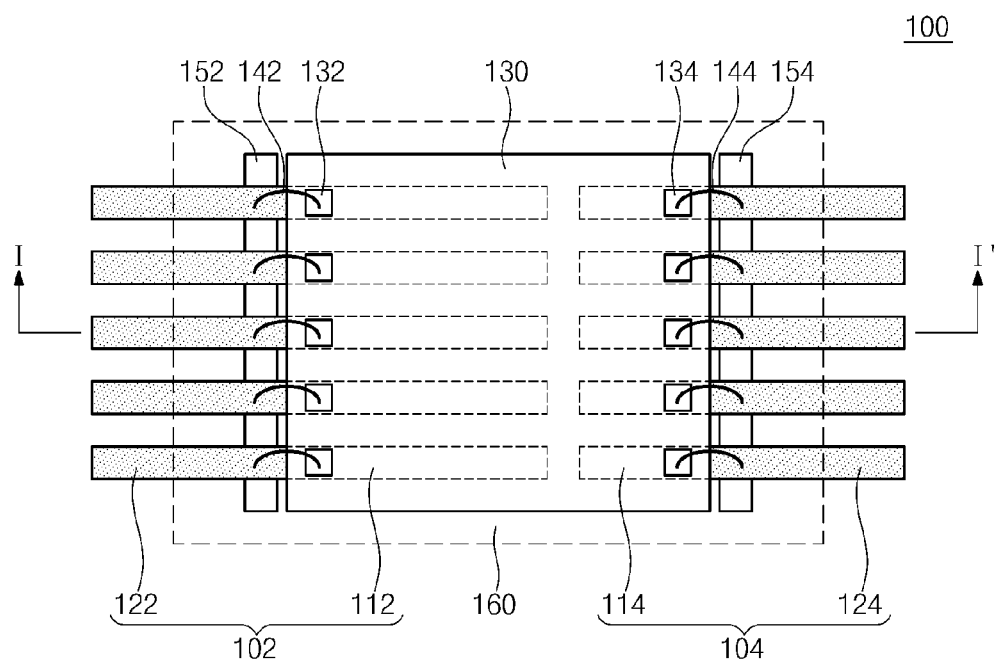
FIG. 1A is a schematic plan view of a semiconductor package according to example embodiments of the inventive concepts.

Various example embodiments will be described more fully hereinafter with reference to the accompanying drawings, in which some example embodiments are shown. The present inventive concepts may, however, be embodied in many different forms and should not be construed as limited to the example embodiments set forth herein, It will be understood that when an element is referred to as being "on," "connected to" or "coupled to" to another element or layer, it can be directly on, connected or coupled to the other element or layer or intervening elements or layers may be present. In contrast, when an element is referred to as being "directly on," "directly connected to" or "directly coupled to" to another element or layer, there are no intervening elements or layers present. Like numerals refer to like elements throughout. As used herein the term "and/or" includes any and all combinations of one or more of the associated listed items. Other words used to describe the relationship between elements or layers should be interpreted in a like fashion, for example, "between" versus "directly between" and "adjacent" versus "directly adjacent".

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments of the inventive concepts are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments of the inventive concepts should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Embodiment 1

Figure 1B:
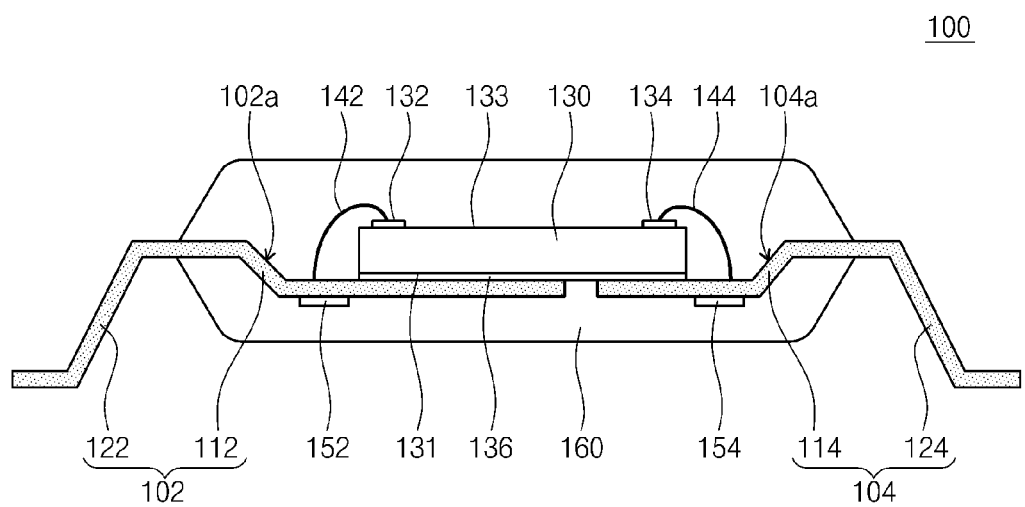
FIG. 1B is a schematic cross-sectional view taken along line I-I' of FIG. 1A according to example embodiments of the inventive concepts.

FIG. 1A is a schematic plan view of a semiconductor package according to an example embodiments of the inventive concepts. FIG. 1B is a schematic cross-sectional view taken along line I-I' of FIG. 1A.

Referring to FIGS. 1A and 1B, a semiconductor package 100 may include a semiconductor chip 130, lead frames 102 and 104 electrically connecting the semiconductor chip 130 with another electronic device, for example, a printed circuit board or a memory module substrate, and a molding layer 160 encapsulating the semiconductor chip 130. In some embodiments, the semiconductor package 100 may be a thin-small-outline package (TSOP) in which the semiconductor chip 130 may be packaged using a chip-on-lead (COB) manner. According to example embodiments, the lead frames 102 and 104 may serve as a connecting portion for providing an electrical connection with the semiconductor chip 130 as well as a mounting portion for mounting the semiconductor chip 130 thereon. Moreover, the lead frames 102 and 104 may have a two side inner lead frame structure capable of supporting the semiconductor chip 130 at both sides thereof.

The semiconductor chip 130 may be a memory chip and/or a logic chip. The semiconductor chip 130 may be mounted on the lead frames 102 and 104 and fastened to the lead frames 102 and 104 by an adhesion layer 136. The lead frames 102 and 104 may include a plurality of first lead frames 102 and a plurality of second lead frames 104, which may be configured to support a bottom surface of the semiconductor chip 130 at a first side and a second side, respectively, of the semiconductor chip 130. The first lead frames 102 may include first inner leads 112 configured to support the semiconductor chip 130 and first outer leads 122 extending from the first inner leads 112. The first inner leads 112 may be encapsulated by the molding layer 160 and the first outer leads 122 may protrude outward from the molding layer 160. Similarly, the second lead frames 104 may include second inner leads 114 configured to support the semiconductor chip 130 and second outer leads 124 extending from the second inner leads 114. The second inner leads 114 may be encapsulated by the molding layer 160 and the second outer leads 124 may protrude outward from the molding layer 160. Each of the first inner leads 112 may include a first incline surface 102a sloping downward and inward toward a bottom surface 131 of the semiconductor chip 130, and each of the second inner leads 114 may include a second incline surface 104a sloping downward and inward toward the bottom surface 131 of the semiconductor chip 130. In some embodiments, the first and second incline surfaces 102a and 104a may be arranged to have mirror symmetry. Since the first and second inner leads 112 and 114 have the first and second incline surfaces 102a and 104a, respectively, the semiconductor package 100 may have a down-set configuration. In some embodiments, each of the first and second incline surfaces 102a and 104a are formed between first and second substantially flat extended portions. The first outer lead 122 may include an outward extended potion extended from the first inner lead 112, a bent portion extended from the outward extended potion and another outward extended portion extended from the bent portion. The second outer lead 124 may include an outward extended potion extended from the second inner lead 114, a bent portion extended from the outward extended potion and an outward extended portion extended from the bent portion. In some embodiments, the first outer lead 122 and the second outer lead 124 may be configured to have mirror symmetry.

The semiconductor chip 130 may have an edge pad structure. In some embodiments, the semiconductor chip 130 may include a plurality of first edge pads 132 arranged in a row on a first side of a top surface 133 thereof, for example, a left side, and a plurality of second edge pads 134 arranged in a row on a second side of a top surface 133 thereof, for example, a right side. The first lead frames 102 may be arranged parallel to a direction in which the first edge pads 132 are arranged on the first side of the top surface 133 of the semiconductor chip 130. Similarly, the second lead frames 104 may be arranged parallel to a direction in which the second edge pads 134 are arranged on the second side of the top surface of the semiconductor chip 130. The semiconductor chip 130 may be electrically connected to the first and second lead frames 102 and 104 via a plurality of first bonding wires 142 and a plurality of second bonding wires 144. The first bonding wires 142 may be configured to connect the first edge pads 132 with the first inner leads 112, and the second bonding wires 144 may be configured to connect the second edge pads 134 and the second inner leads 114. In some embodiments, the first and second inner leads 112 and 114 of the first and second lead frames 102 and 104, respectively, may be used as the mounting portion for mounting the semiconductor chip 130 thereon as well as the connecting portion for providing an electrical connection with the semiconductor chip 130.

Lengths of the first and second inner leads 112 and 114 may be substantially the same as or different from each other. In some embodiments, each of the first inner leads 112 may have substantially the same length as the other first inner leads 112, and each of the second inner leads 114 may have substantially the same length as the other second inner leads but may be shorter than the first inner leads 112. From a schematic plan view, the first and second inner leads 112 and 114 may not run across the semiconductor chip 130, and, thus, the first and second inner leads 112 and 114 may have ends disposed under the semiconductor chip 130. With regard to the lengths of the first and second inner leads 112 and 114, example embodiments of the inventive concepts are not limited to the lengths described herein.

The semiconductor package 100 may further include a pair of fixing tapes 152 and 154. In some embodiments, a first fixing tape 152 may be configured to fasten the first inner leads 112 and a second fixing tape 154 may be configured to fasten the second inner leads 114. The first fixing tape 152 may be a polyimide tape to run across the first inner leads 112. Similarly, the second fixing tape 154 may be a polyimide tape to run across the second inner leads 114. In some embodiments, the first and second fixing tapes 152 and 154 may adhere to one of top and bottom surfaces of the first and second inner leads 112 and 114. FIG. 1B illustrates the first and second fixing tapes 152 and 154 adhered to bottom surfaces of the first and second inner leads 112 and 114, respectively. Since the first and second inner leads 112 and 114 are fastened by the first and second fixing tapes 152 and 154, respectively, it is possible to prevent movement of the first and second inner leads 112 and 114 from their original positions and/or physical contact between the first and second inner leads 112 and 114.

According to example embodiments of the inventive concepts, the inner leads 112 and 114 may be used as the mounting portions capable of supporting the semiconductor chip 130 at both sides of the semiconductor chip 130. As a result, the semiconductor chip 130 can be more stably supported. Furthermore, it is possible to reduce a process failure, which may be caused from a quantitative imbalance of a molding material during forming the molding layer 160, and increase bondability in a wire-bonding process. These technical features will be described in further detail by comparing embodiments depicted by FIGS. 1B and 1C, respectively.

Figure 1C:
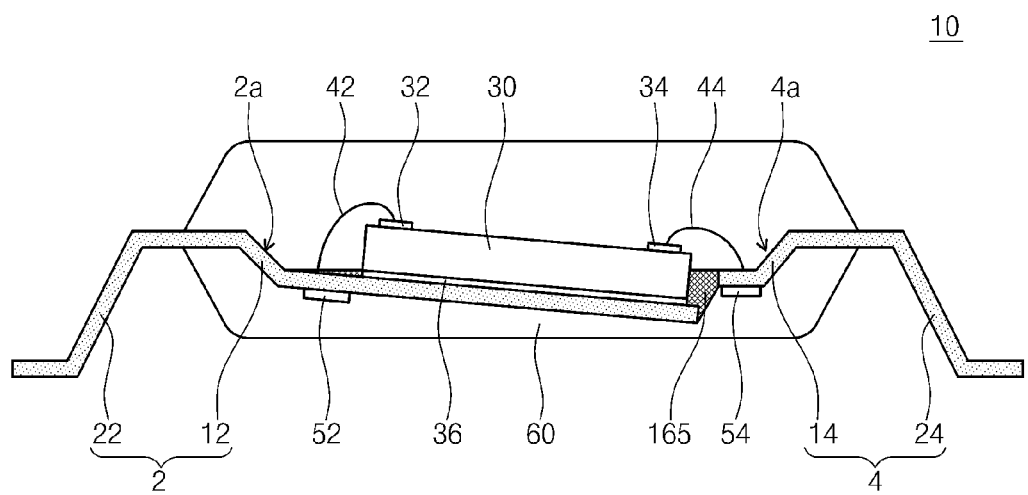
FIG. 1C is a schematic cross-sectional view of a semiconductor package according to a comparative embodiment.

FIG. 1C is a schematic cross-sectional view of a semiconductor package according to a comparative embodiment.

Referring to FIG. 1C, a semiconductor package 10 may include a semiconductor chip 30, which is mounted on first lead frames 2 using an adhesion layer 36 and encapsulated by a molding layer 60. The first lead frames 2 may include inner lead frames 12 having inclined surface 2a and outer lead frames 22 and second lead frames 4 may include inner lead frames 14 having inclined surface 4a and outer lead frames 24. The semiconductor chip 30 may include a plurality of first edge pads 32 and second edge pads 34. A first fixing tape 52 may be configured to fasten the first inner leads 12 and a second fixing tape 54 may be configured to fasten the second inner leads 14. In this embodiment, the semiconductor chip 30 may be mounted on the first lead frames 2 (especially, inner lead frames 12), not on second lead frames 4. In this embodiment, the first inner leads 12 may be warped downward due to an insufficient supporting force, and as shown in FIG. 1C, a portion of the semiconductor chip 30 may hang down. As a result, the semiconductor chip 30 may be asymmetrically disposed in the semiconductor package 10. This may result in deterioration in bondability of bonding wires 42 and 44. Furthermore, due to the slanted semiconductor chip 30, a molding material (for example, an epoxy molding compound (EMC)) for the molding layer 60 may not be uniformly supplied during a molding process. Accordingly, a process failure, for instance, a void 165 formed in the molding layer 60, may occur. By contrast, according to example embodiments of the inventive concepts described with reference to FIG. 1B, since the first and second inner leads 112 and 114 support the semiconductor chip 130 at both sides of the semiconductor chip 130, the aforementioned difficulties described with reference to FIG. 1C can be overcome.

Alternative Embodiments of Embodiment 1

Semiconductor packages according to alternative exemplary embodiments of the inventive concepts will be described with reference to FIGS. 2A through 2F. FIGS. 2A through 2C and FIGS. 2D through 2F are schematic cross-sectional views and schematic plan views, respectively, of the semiconductor packages according to example embodiments of the inventive concepts. Description of elements previously described with reference to FIGS. 1A and 1B may be omitted.

Figure 2A:
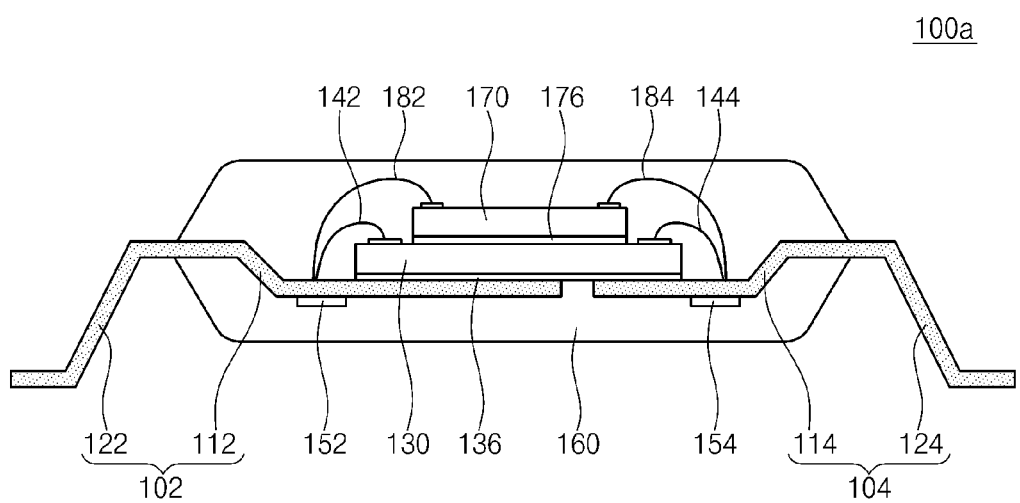
FIGS. 2A through 2C are schematic cross-sectional views of semiconductor packages according to example embodiments of the inventive concepts.

Referring to FIG. 2A, a semiconductor package 100a may further include a semiconductor chip 170 stacked on the semiconductor chip 130, thereby having an increased packing density. In some embodiments, the semiconductor chip 170 may have a small size compared with the semiconductor chip 130. The semiconductor chip 170 may be the same kind as or a different kind from the semiconductor chip 130. For instance, the semiconductor chip 170 may be a memory chip or a logic chip. The semiconductor chip 170 may be face-up mounted on the semiconductor chip 130 using an adhesion layer 176 as an intervening layer and electrically connected to the first and second inner leads 112 and 114 via bonding wires 182 and 184, respectively.

Figure 2B:
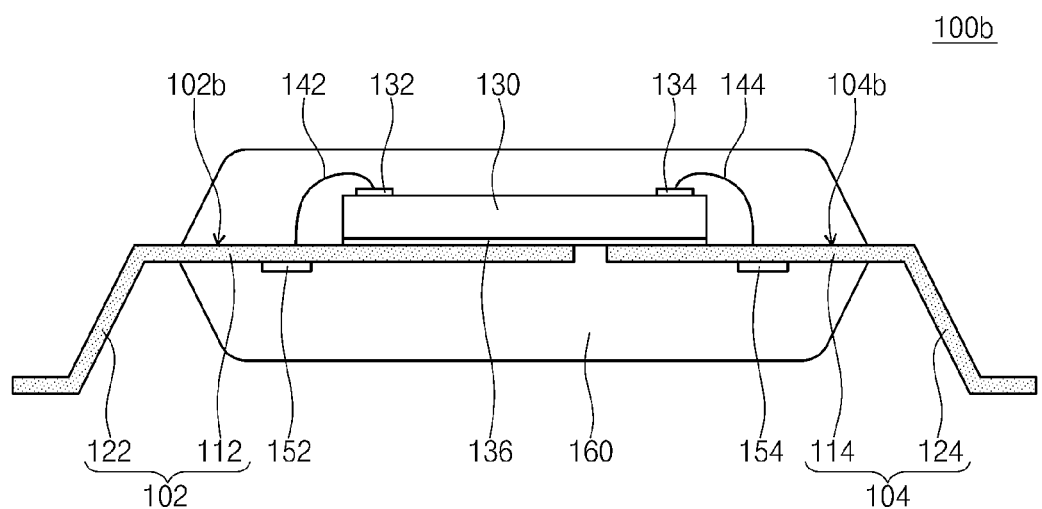

Referring to FIG. 2B, a semiconductor package 100b may not have the down-set configuration as in the embodiments of FIGS. 1A and 1B. For example, the first inner lead 112 may include a first substantially flat surface 102b on which the semiconductor chip 130 is mounted. Similarly, the second inner lead 114 may include a second substantially flat surface 104b. In the case in which the first and second lead frames 102 and 104 have the down-set configuration of FIGS. 1A and 1B, the semiconductor chip 130 thereon may have a limitation on size. However, there may be no such limitation in the semiconductor package 100b illustrated in FIG. 2B in which the first and second inner lead frames 112 and 114 have first and second substantially flat surfaces 102b and 104b.

Figure 2C:
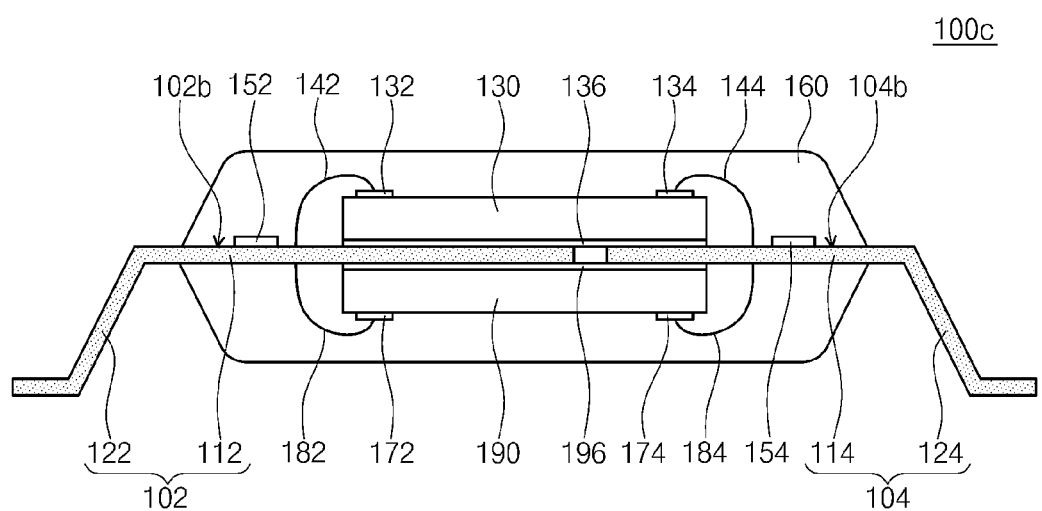

Referring to FIG. 2C, a semiconductor package 100c may include semiconductor chips 130 and 190 mounted on and under the first and second inner leads 112 and 114, respectively, using an adhesion layer 196. For example, the semiconductor chip 130 may be mounted on top surfaces of the first and second inner leads 112 and 114, and the semiconductor chip 190 may be mounted on bottom surfaces of the first and second inner leads 112 and 114. The semiconductor chip 190 may be the same kind as or a different kind from the semiconductor chip 130. For instance, the semiconductor chip 190 may be a memory chip or a logic chip. The first and second inner leads 112 and 114 may include flat surfaces 102b and 104b, respectively, similar to FIG. 2B. Accordingly, the bottom surfaces of the first and second inner leads 112 and 114 may be large enough to mount the semiconductor chip 190. The fixing tapes 152 and 154 may adhere to at least one of top and bottom surfaces of the first and second inner leads 112 and 114. In FIG. 2C, the fixing tapes 152 and 154 adhere to the top surfaces of the first and second inner leads 112 and 114, respectively. The semiconductor chip 190 may include a plurality of first edge pads 172 and second edge pads 174. The semiconductor chip 190 may be electrically connected to the first and second inner leads 112 and 114 via bonding wires 182 and 184, respectively. The first lead frame 102 connected to the semiconductor chip 130 may be the same one as or a different one from the first lead frame 102 connected to the semiconductor chip 190. Similarly, the second lead frame 104 connected to the semiconductor chip 130 may be the same one as or a different one from the second lead frame 104 connected to the semiconductor chip 190.

Figure 2D:
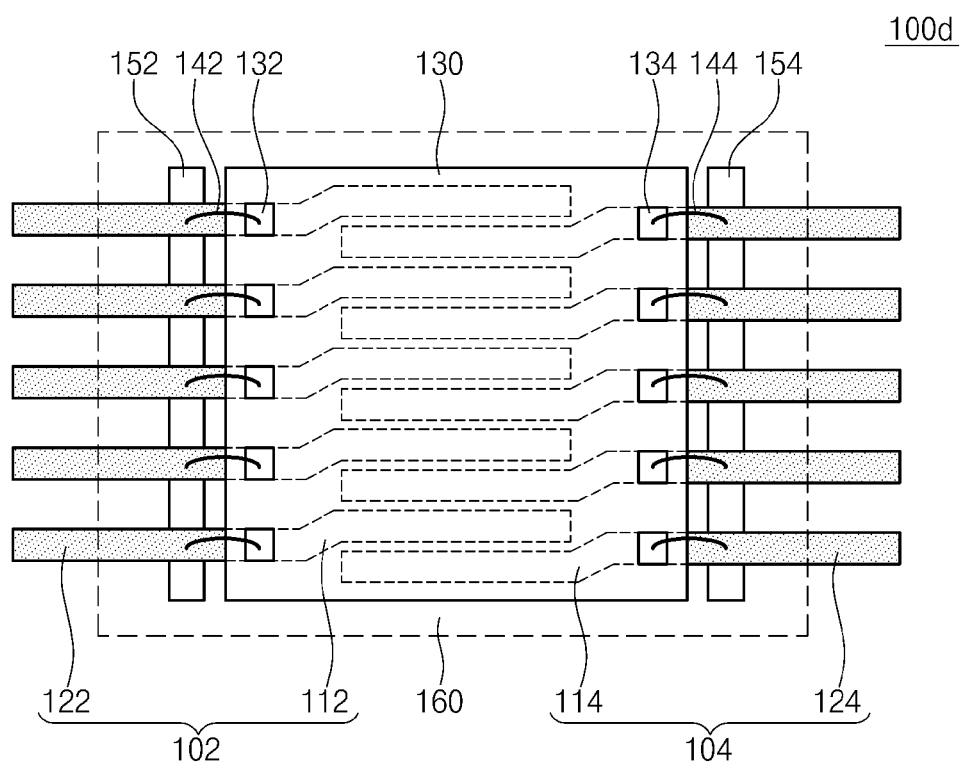
FIGS. 2D through 2F are schematic plan views of semiconductor packages according to example embodiments of the inventive concepts.

Referring to FIG. 2D, a semiconductor package 100d may include the second inner leads 114 extending between the first inner leads 112. For instance, the first inner leads 112 may be disposed in odd-numbered rows, and the second inner leads 114 may be disposed in even-numbered rows. According to the embodiment of FIG. 2D, the semiconductor chip 130 may be stably supported by the first and second inner leads 112 and 114 arranged in an alternating manner.

Figure 2E:
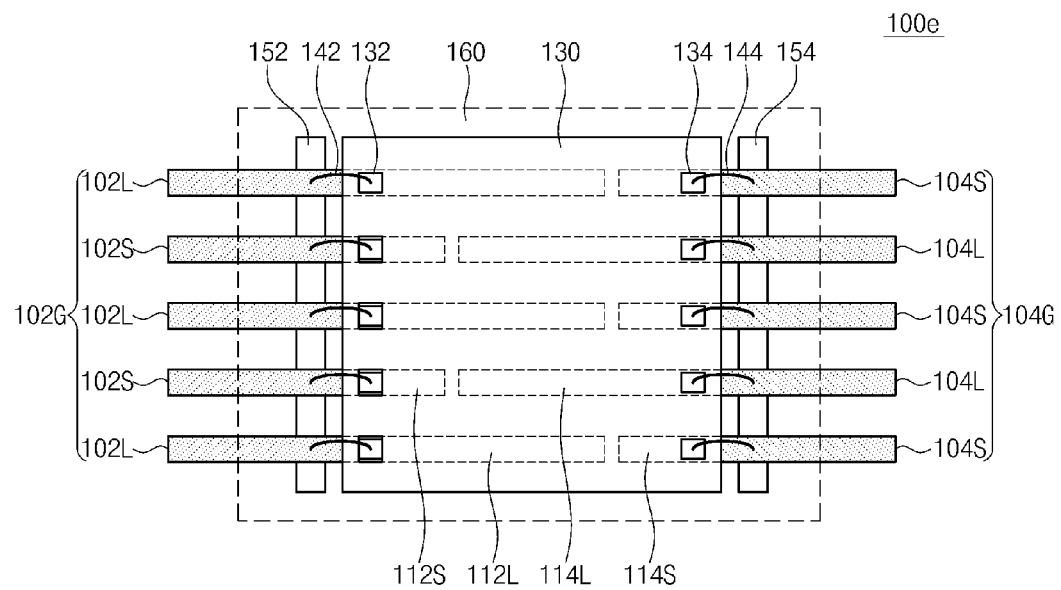

Referring to FIG. 2E, a semiconductor package 100e may include a first lead frame group 102G and a second lead frame group 104G. In the embodiment of FIG. 2E, the first lead frame group 102G may include long first lead frames 102L and short first lead frames 102S arranged in an alternating manner, and the second lead frame group 104G may include short second lead frames 104S and long second lead frames 104L arranged in an alternating manner. The long first lead frames 102L may be disposed to be adjacent to the short second lead frames 104S, respectively, and the short first lead frames 102S may be disposed to be adjacent to the long second lead frames 104L, respectively. The semiconductor chip 130 may be mounted on long and short first inner leads 112L and 112S, respectively, and short and long second inner leads 114S and 114L. According to the embodiment of FIG. 2E, the long and short first inner leads 112L and 112S may support a bottom surface of the semiconductor chip 130 at a first side thereof, and the short and long second inner leads 114S and 114L may support the bottom surface of the semiconductor chip 130 at a second side thereof. As a result, it is possible to provide a package structure stably mounted with the semiconductor chip 130. Furthermore, the long first inner leads 112L and long second inner leads 114L may be arranged in a zigzag manner in conjunction with the short first inner leads 112S and short second inner leads 114S, and, thus, it is possible to prevent an inclination of the semiconductor chip 130.

Figure 2F:
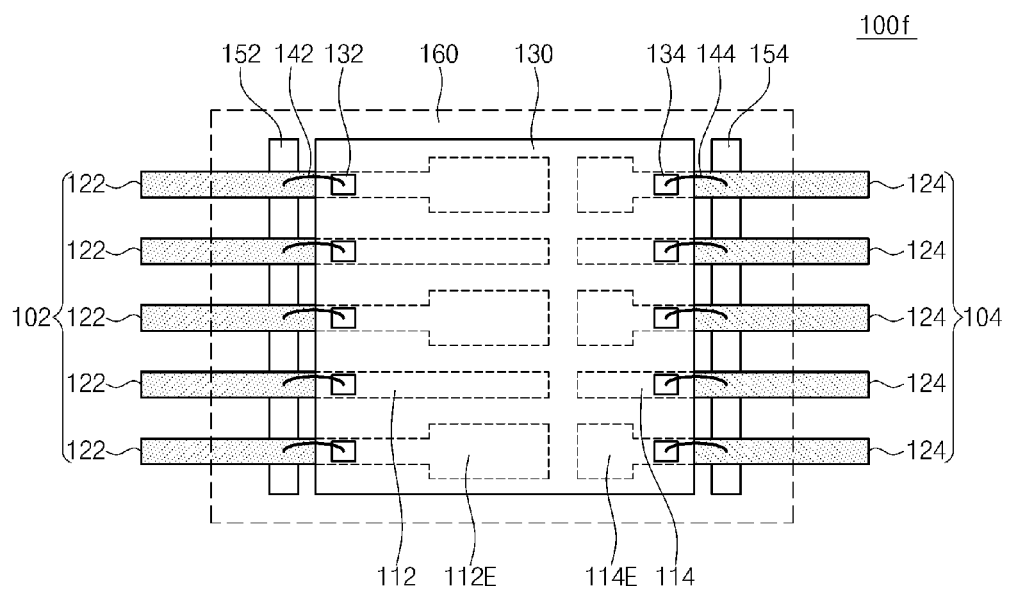

Referring to FIG. 2F, a semiconductor package 100f may include enlarged first and second inner leads 112E and 114E, each of which may have an increased width compared with the first and second outer leads 122 and 124. For instance, at least one of the first lead frames 102 may include the enlarged first inner lead 112E having an increased width compared with the first outer lead 122. Similarly, at least one of the second lead frames 104 may include the enlarged second inner lead 114E having an increased width compared with the second outer lead 124. The enlarged first inner leads 112E may be disposed between non-enlarged ones of the first inner leads 112. Similarly, the enlarged second inner leads 114E may be disposed between non-enlarged ones of the second inner leads 114. In some embodiments, each of the enlarged first inner leads 112E may be disposed to face the corresponding one of the enlarged second inner leads 114E. In some embodiments, each of the enlarged first inner leads 112E may be disposed to face the non-enlarged one of the second inner leads 114 and the enlarged second inner leads 114 may be disposed to face the non-enlarged one of the first inner leads 112. Due to the enlarged first and second inner leads 112E and 114E, a mounting area of the semiconductor chip 130 can be relatively enlarged.

Embodiment 2

Figure 3A:
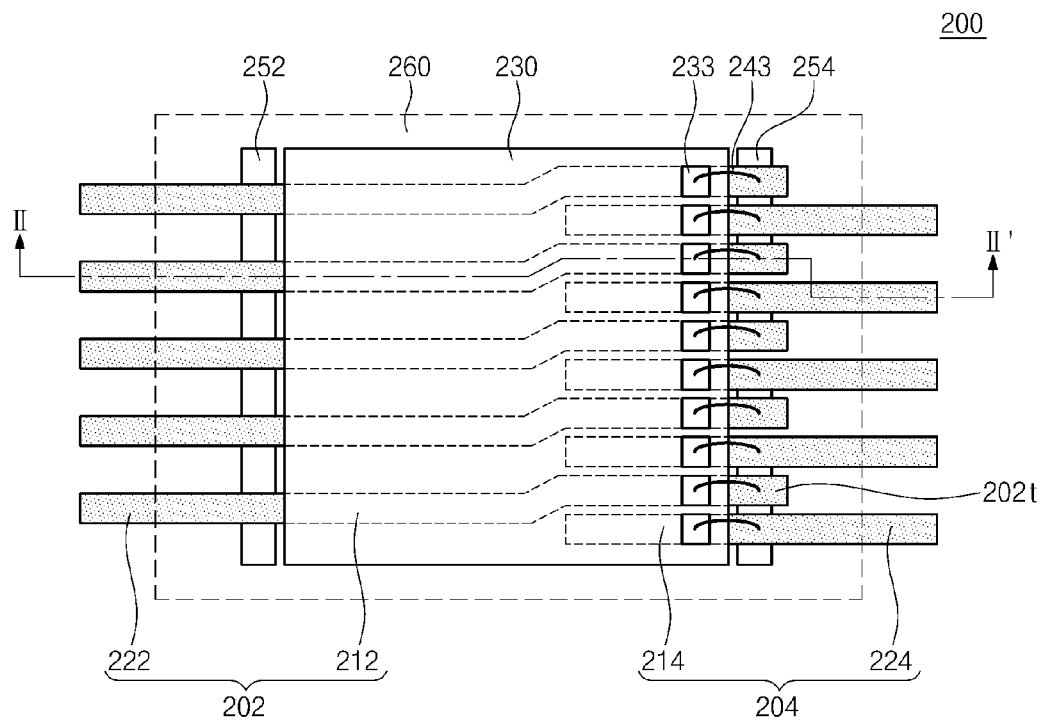
FIG. 3A is a schematic plan view illustrating a semiconductor package according to example embodiments of the inventive concepts.
Figure 3B:
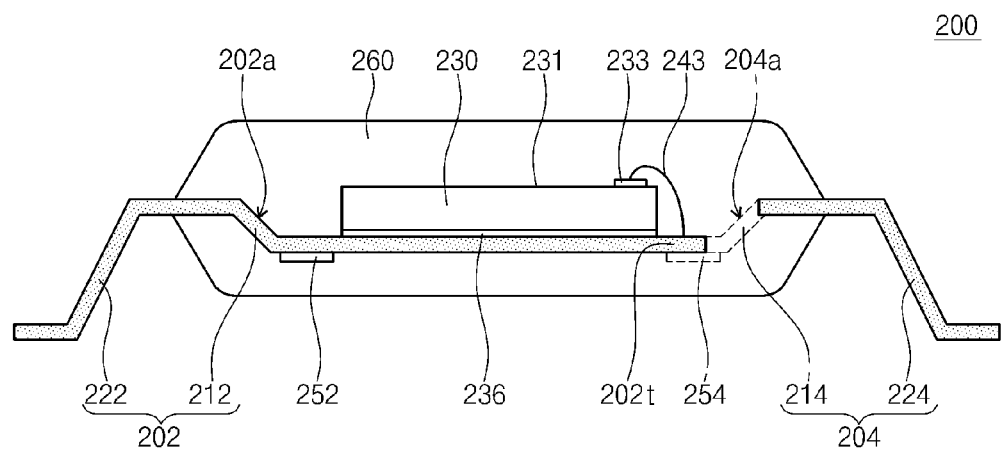
FIG. 3B is a schematic cross-sectional view taken along line II-II' of FIG. 3A according to example embodiments of the inventive concepts.

FIG. 3A is a schematic plan view illustrating a semiconductor package according to example embodiments of the inventive concepts. FIG. 3B is a schematic cross-sectional view taken along line of FIG. 3A.

Referring to FIGS. 3A and 3B, a semiconductor package 200 may be a thin-small-outline package (TSOP) in which a semiconductor chip 230 may be mounted on first and second lead frames 202 and 204 using an adhesion layer 236 and encapsulated by a molding layer 260. The semiconductor chip 230 may be a memory chip and/or a logic chip, and include edge pads 233 arranged in a row on one side edge of the top surface 231 thereof. The first and second lead frames 202 and 204 may include a plurality of first lead frames 202 extending in a first direction, for example, rightward, from a first side, for example, a left side, of the semiconductor chip 230 and a plurality of second lead frames 204 extending in a second direction, for example, leftward from a second side, for example a right side, of the semiconductor chip 230. The first lead frame 202 may include first inner leads 212 on which the semiconductor chip 230 is mounted and first outer leads 222 extending outward from the first inner leads 212 beyond the molding layer 260. Similarly, the second lead frame 204 may include second inner leads 214 on which the semiconductor chip 230 is mounted and second outer leads 224 extending outward from the second inner leads 214 beyond the molding layer 260. The first lead frames 202 may be fastened by a first fixing tape 252 adhered on bottom or top surfaces of the first inner leads 212, and the second lead frames 204 may be fastened by a second fixing tape 254 adhered on bottom or top surfaces of the second inner leads 214. In the embodiment of FIGS. 3A and 3B, the first and second fixing tapes 252 and 254 are adhered on bottom surfaces of the first and second inner leads 212 and 214, respectively. The first inner lead 212 may include a first incline surface 202a and the second inner lead 214 may include a second incline surface 204a, and thus the semiconductor package 200 may have a down-set configuration.

From a schematic plan view as shown in FIG. 3A, one of the first and second lead frames 202 and 204, for example, the first lead frames 202, may run across the semiconductor chip 230 to protrude from both sides of the semiconductor chip 230, and the other thereof, for example, the second lead frames 204, may not run across the semiconductor chip 230.

For example, the semiconductor chip 230 may include edge pads 233 arranged on a right top surface thereof, and, from a plan view, the first inner leads 212 of the first lead frames 202 may include end portions 202t protruding rightward beyond the semiconductor chip 230. The semiconductor chip 230 may be electrically connected to the first and second lead frames 202 and 204 via bonding wires 243 connected to the end portions 202t of the first inner leads 212 and the second inner leads 214, respectively.

According to the embodiment of FIGS. 3A and 3B, as described with reference to FIGS. 1A and 1B, the semiconductor chip 230 can be more stably supported by the first and second inner leads 212 and 214, and the molding layer 260 can be formed without a quantitative imbalance. In addition, although the edge pads 233 are arranged on one side edge of the top surface 231 of the semiconductor chip 230, the semiconductor chip 230 may be easily connected to the first and second lead frames 202 and 204 via the bonding wires 243, because the first inner leads 212 protrude from one edge adjacent to the edge pads 233 of the semiconductor chip 230.

Alternative Embodiments of Embodiment 2

Semiconductor packages according to alternative embodiments of the inventive concepts will be described with reference to FIGS. 4A through 4E. FIGS. 4A and 4B and FIGS. 4C through 4E are schematic cross-sectional views and schematic plan views, respectively, of the semiconductor packages according to alternative embodiments of the inventive concepts. Description of elements previously described with reference to FIGS. 3A and 3B may be omitted.

Figure 4A:
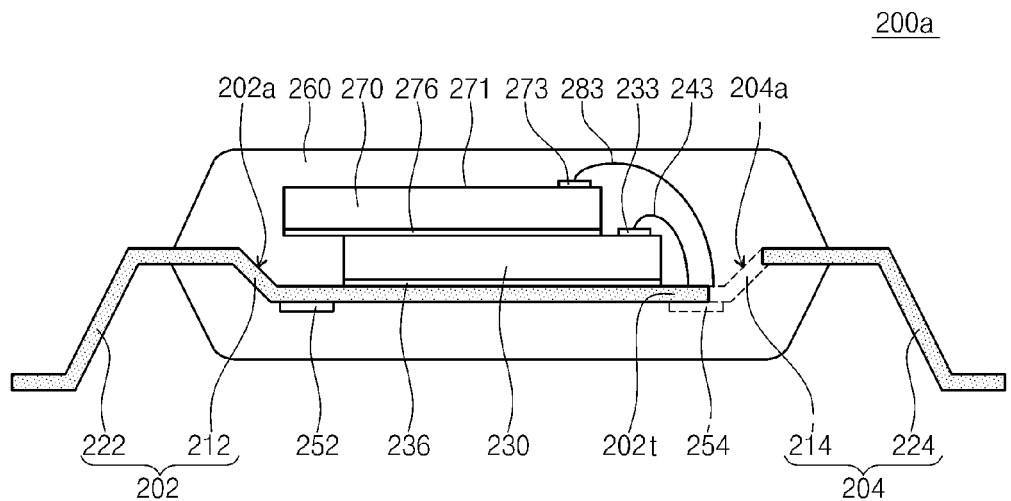
FIGS. 4A and 4B are schematic cross-sectional views of semiconductor packages according to example embodiments of the inventive concepts.

Referring to FIG. 4A, a semiconductor package 200a may further include a semiconductor chip 270, which may be attached on the semiconductor chip 230 using an adhesion layer 276. The semiconductor chip 270 may include edge pads 273 arranged on one side edge of a top surface 271 thereof, similar to the semiconductor chip 230. The semiconductor chip 270 may be intentionally misaligned not to cover the edge pads 233 of the semiconductor chip 230; for instance, the semiconductor chip 270 may be stepwise stacked on the semiconductor chip 230. The semiconductor chip 270 may be electrically connected to the second inner leads 214 and end portions 202t of the first inner leads 212 via bonding wires 283.

Figure 4B:
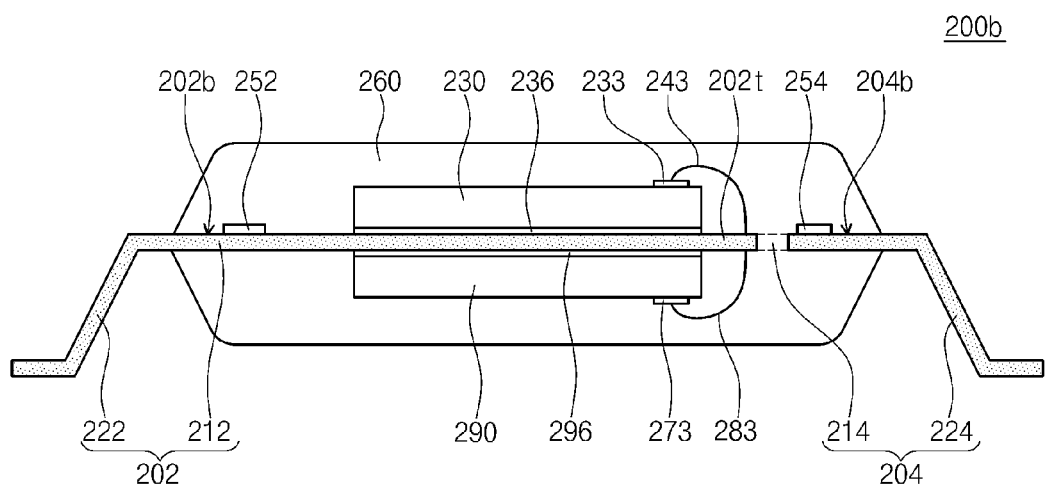

Referring to FIG. 4B, a semiconductor package 200b may include semiconductor chips 230 and 290 mounted on and under the first and second inner leads 212 and 214, respectively, using an adhesion layer 296. For example, the first and second inner leads 212 and 214 may include substantially flat surfaces 202b and 204b, respectively, and the semiconductor chip 230 may be mounted on top surfaces of the substantially flat surfaces 202b and 204b and the semiconductor chip 290 may be mounted on bottom surfaces of the substantially flat surfaces 202b and 204b.

Figure 4C:
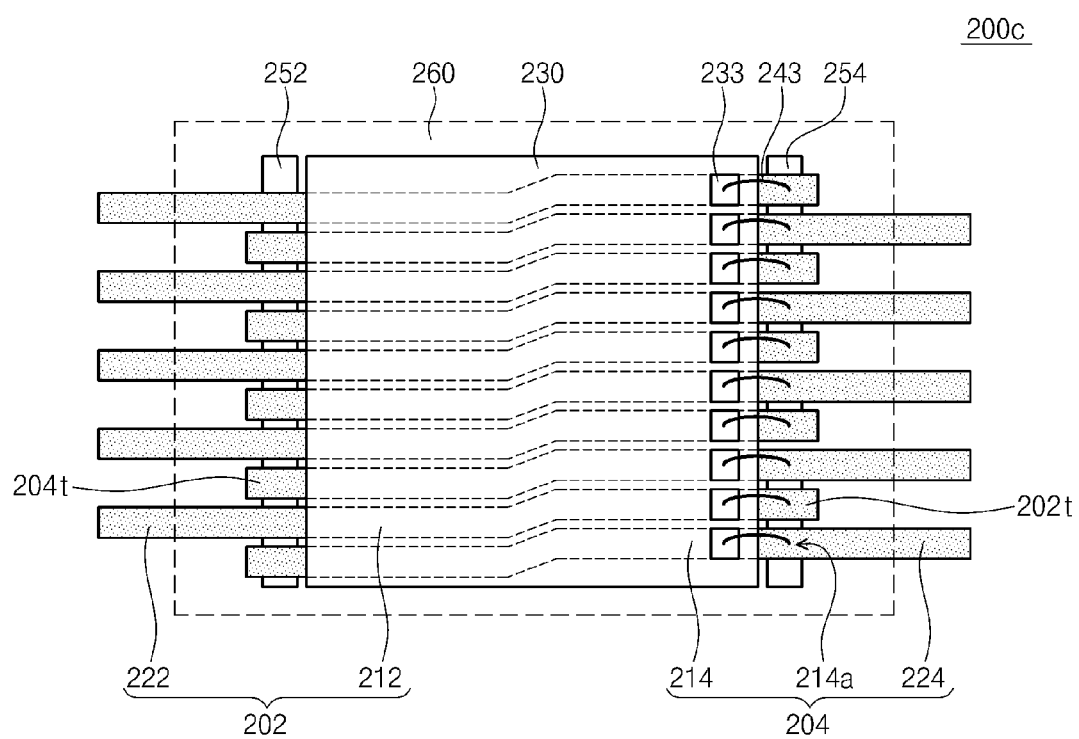
FIGS. 4C through 4E are schematic plan views of semiconductor packages according to example embodiments of the inventive concepts.

Referring to FIG. 4C, a semiconductor package 200c may include first and second lead frames 202 and 204, which include end portions 202t and 204t protruding outward beyond the semiconductor chip 230, respectively. For example, the first and second lead frames 202 and 204 may include first and second inner leads 212 and 214, respectively, and the first and second inner leads 212 and 214 may include first and second end portions 202t and 204t protruding in a first and a second direction, for example, rightward and leftward, respectively, toward the outside of the semiconductor chip 230. The semiconductor chip 230 may include edge pads 233 arranged on a first side, for example, a right side, of a top surface thereof. Furthermore, the semiconductor chip 230 may be electrically connected to the first and second lead frames 202 and 204 via bonding wires 243. The bonding wire 243 may be connected to the first end portion 202t of the first inner lead 212. The bonding wire 243 may be connected to a portion 214a of the second lead frame 204 exposed at the right side of the semiconductor chip 230, not to the second end portion 204t of the second inner lead 214. According to the embodiment of FIG. 4C, the first inner leads 212 and the second inner leads 214 may be long enough to run across the semiconductor chip 230, and, thus, the semiconductor chip 230 can be more stably supported by the first and second inner leads 212 and 214. In some embodiments, at least one of the first and second inner leads 212 and 214 may be configured to have a bent shape or a line shape.

Figure 4D:
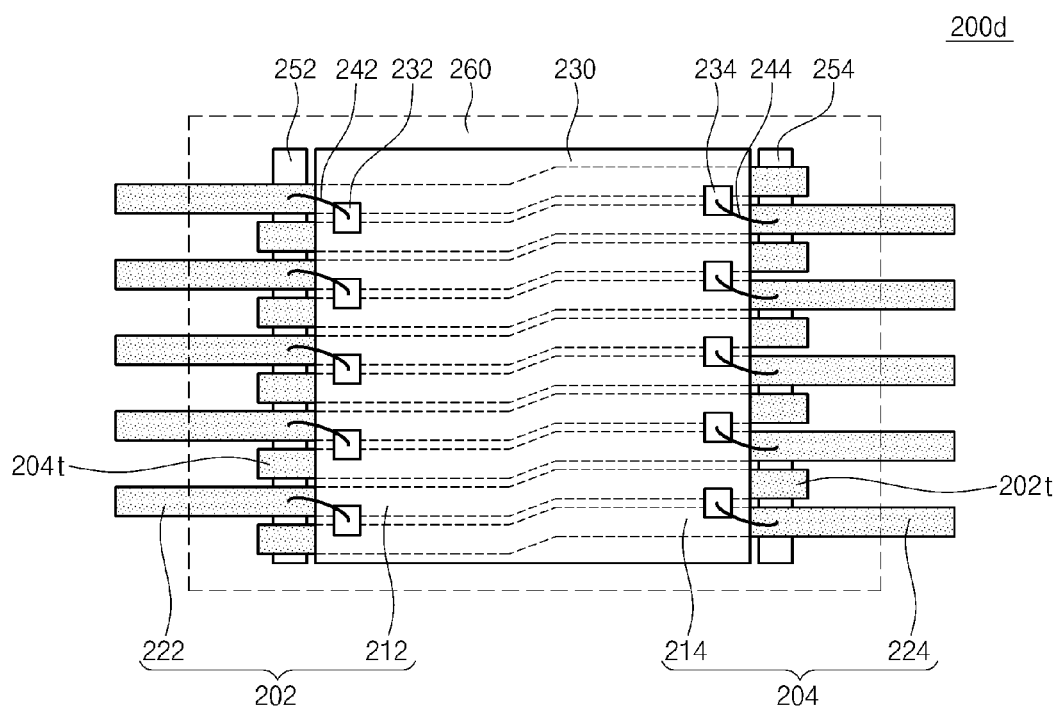

Referring to FIG. 4D, a semiconductor package 200d may include a semiconductor chip 230, first inner leads 212, and second inner leads 214. Here, the semiconductor chip 230 may include first edge pads 232 and second edge pads 234, which are arranged on first and second edges, for example, left and right edges, respectively, of a top surface of the semiconductor chip 230. The first and second inner leads 212 and 214 may include first and second end portions 202t and 204t, respectively, protruding in a first direction and a second direction, for example, rightward and leftward, respectively, toward the outside of the semiconductor chip 230. The first edge pads 232 may be connected to the first inner leads 212 via first bonding wires 242, and the second edge pads 234 may be connected to the second inner leads 214 via second bonding wires 244. Due to the electric connection using the first and second bonding wires 242 and 244, the semiconductor chip 230 can be electrically connected to the first and second lead frames 202 and 204. According to the embodiment of FIG. 4D, the bonding wires 242 and 244 may not be connected to the first and second end portions 202t and 204t. Each of the first and second edge pads 232 and 234 overlap both of the first and second inner leads 212 and 214.

Figure 4E:
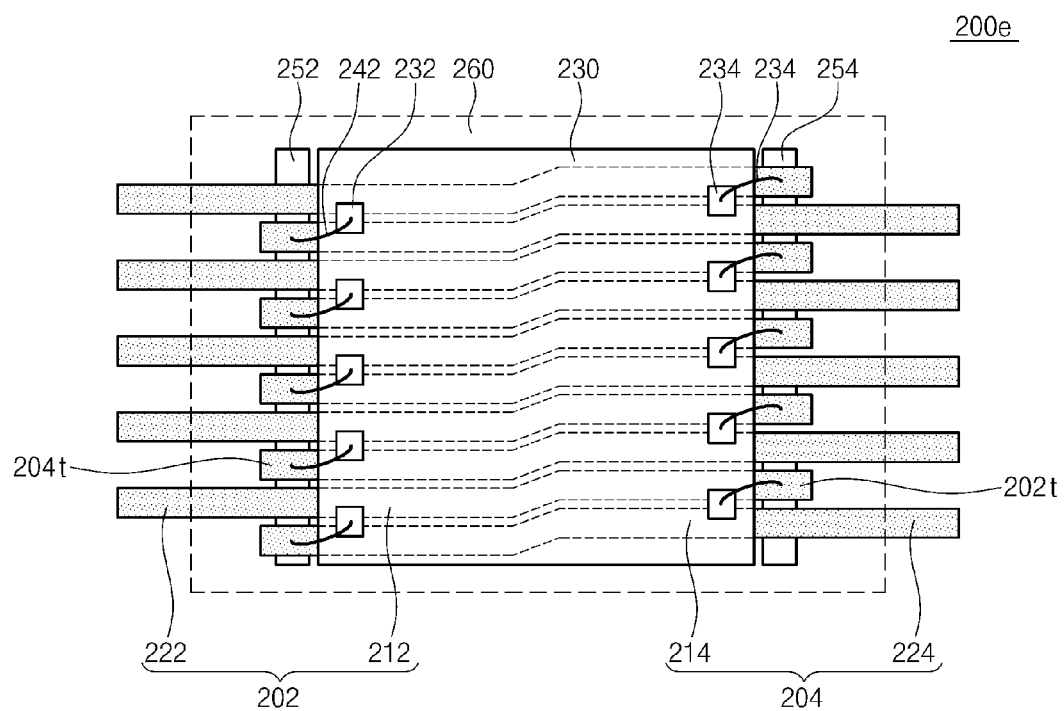

Referring to FIG. 4E, a semiconductor package 200e may be configured to be similar to the semiconductor package 200d described with reference to FIG. 4D, except for the wiring ways of the bonding wires. For instance, the semiconductor chip 230 can be electrically connected to the first and second lead frames 202 and 204 in such a way that the first and second bonding wires 242 and 244 are connected to the second end portions 204t and the first end portions 202t, respectively, rather than the first and second inner leads 212 and 214, respectively.

Embodiment 3

Figure 5A:
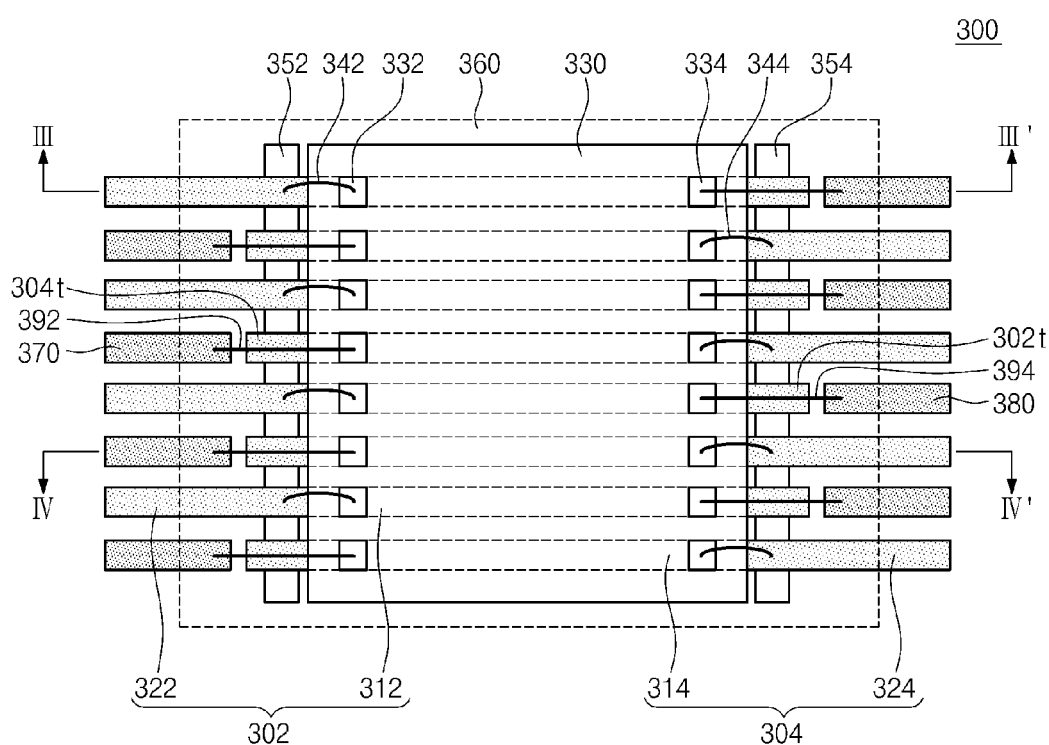
FIG. 5A is a schematic plan view illustrating a semiconductor package according to example embodiments of the inventive concepts.
Figure 5B:
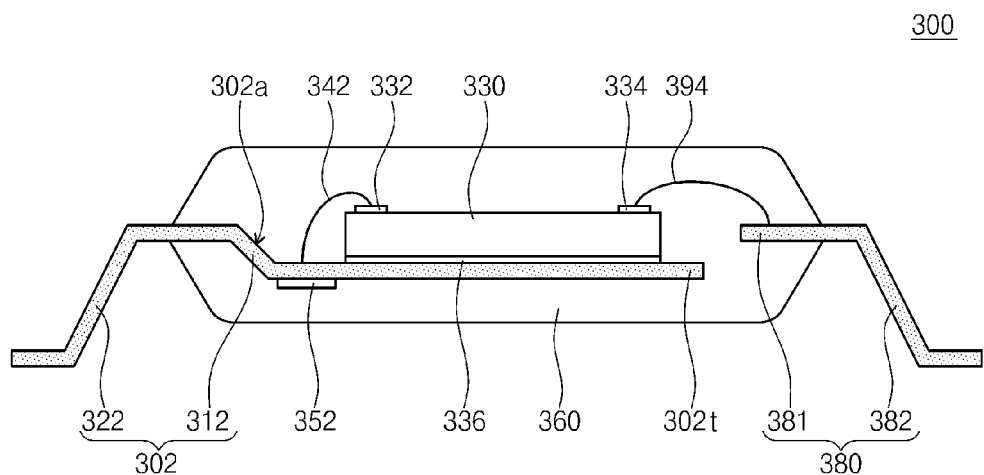
FIG. 5B is a schematic cross-sectional view taken along line of FIG. 5A according to example embodiments of the inventive concepts.
Figure 5C:
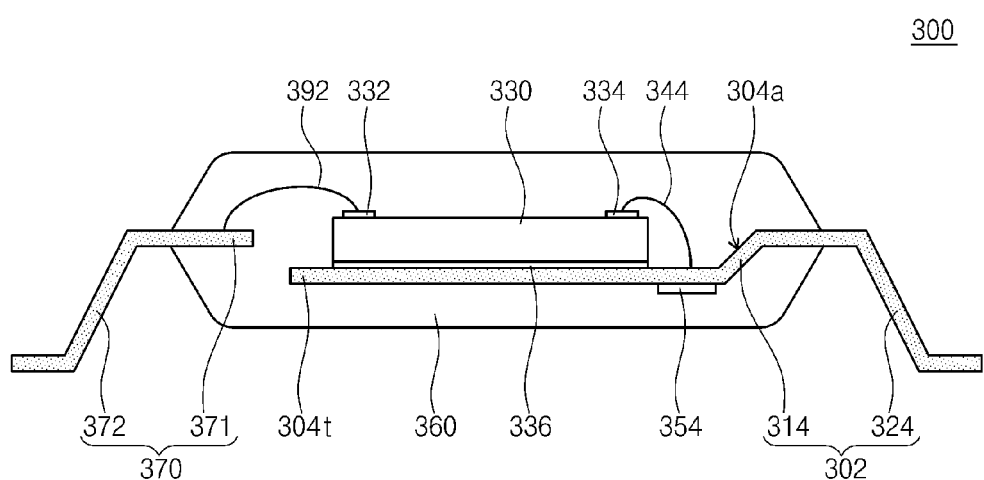
FIG. 5C is a schematic cross-sectional view taken along line IV-IV' of FIG. 5A according to example embodiments of the inventive concepts.

FIG. 5A is a schematic plan view illustrating a semiconductor package according to example embodiments of the inventive concepts. FIGS. 5B and 5C are schematic cross-sectional views taken along lines III-III' and IV-IV' of FIG. 5A, respectively.

Referring to FIGS. 5A through 5C, a semiconductor package 300 may be a thin-small-outline package (TSOP) in which a semiconductor chip 330 may be mounted on first and second lead frames 302 and 304 and encapsulated by a molding layer 360. In the present embodiments, the semiconductor package 300 may further include third and fourth lead frames 370 and 380 that are connected to the semiconductor chip 330 but are not used to support the semiconductor chip 330.

The first lead frame 302 may include a first outer lead 322 protruding, in a first direction, for example, leftward, beyond the molding layer 360 and a first inner lead 312 extending, in a second direction, for example, rightward, from the first outer lead 322 to run across the semiconductor chip 330. The second lead frame 304 may include a second outer lead 324 protruding in the second direction, for example, rightward, beyond the molding layer 360 and a second inner lead 314 extending in the first direction, for example, leftward, from the second outer lead 324 to run across the semiconductor chip 330. The first inner lead 312 may include a first end portion 302t protruding in the second direction, for example, rightward beyond the molding layer 360, and the second inner lead 314 may include a second end portion 304t protruding in the first direction, for example, leftward beyond the molding layer 360.

The first lead frames 302 may be fastened by a first fixing tape 352 adhered on bottom or top surfaces of the first inner leads 312, and the second lead frames 304 may be fastened by a second fixing tape 354 adhered on bottom or top surfaces of the second inner leads 314. In the embodiment of FIGS. 5A-5C, the first and second fixing tapes 352 and 354 are adhered to bottom surfaces of the first and second inner leads 312 and 314, respectively. The first inner lead 312 may include a first incline surface 302a and the second inner lead 314 may include a second incline surface 304a, and, thus, the semiconductor package 300 may have a down-set configuration. In some embodiments, the first and second incline surfaces 302a and 304a may be configured to have mirror symmetry with each other. In some embodiments, each of the first and second incline surfaces 302a and 304a are formed between first and second substantially flat extended portions. The first outer lead 322 may include an outward extended potion extended from the first inner lead 312, a bent portion extended from the outward extended potion and another outward extended portion extended from the bent portion. The second outer lead 324 may include an outward extended potion extended from the second inner lead 314, a bent portion extended from the outward extended potion and an outward extended portion extended from the bent portion.

The third lead frames 370 may be closely arranged at a left side of the semiconductor chip 330 and the fourth lead frames 380 may be closely arranged at a right side of the semiconductor chip 330. Each of the third lead frames 370 may be disposed between the first lead frames 302, and each of the fourth lead frames 380 may be disposed between the second lead frames 304. As shown in FIG. 5C, the third lead frame 370 may include a third inner lead 371, which may be spaced apart from the second end portion 304t and encapsulated by the molding layer 360, and a third outer lead 372 extending from the third inner lead 371 outward beyond the molding layer 360. In some embodiments, the third inner lead 371 may include a substantially flat portion and the third outer lead 372 may include an outward extending portion extending from the third inner lead 371, a bent portion extending from the outward extending portion and another outward extending portion extending from the bent portion. As shown in FIG. 5B, the fourth lead frame 380 may include a fourth inner lead 381, which may be spaced apart from the first end portion 302t and encapsulated by the molding layer 360, and a fourth outer lead 382 extending from the fourth inner lead 381 outward beyond the molding layer 360. In some embodiments, the fourth inner lead 381 may include a substantially flat portion and the fourth outer lead 382 may include an outward extending portion extending from the fourth inner lead 381, a bent portion extending from the outward extending portion and another outward extending portion extending from the bent portion.

The semiconductor package 300 may include first bonding wires 342 and third bonding wires 392, which may be configured to electrically connect the semiconductor chip 330 with the first lead frames 302 and the third lead frames 370, respectively, and second bonding wires 344 and fourth bonding wires 394, which may be configured to electrically connect the semiconductor chip 330 with the second lead frames 304 and the fourth lead frames 380. In some embodiments, the semiconductor chip 330 may include first edge pads 332 arranged on a first side, for example a left side, of a top surface thereof and second edge pads 334 arranged on a second side, for example, a right side, of a top surface thereof. The first and third bonding wires 342 and 392 connected to the first and third inner leads 312 and 371, respectively, may be connected to the first edge pads 332, and the second and fourth bonding wires 344 and 394 connected to the second and fourth inner leads 314 and 381, respectively, may be connected to the second edge pads 334.

According to the embodiment of FIGS. 5A-5C, the first and second lead frames 302 and 304 may be arranged in an alternating manner and be long enough to run across a bottom surface of the semiconductor chip 330. As a result, the semiconductor chip 330 can be stably supported and prevented from hanging down on one side. In addition, when pads are arranged on both sides of a top surface of the semiconductor chip 330, the semiconductor chip 330 can be connected to bonding wires at both sides thereof. The embodiments or modifications thereof previously described with reference to FIGS. 1A, 1B, 2A-2F, 3A, 3B, and 4A-4E may be also applied to FIGS. 5A-5C to provide semiconductor packages according to the embodiments.

Applications of Embodiments

Figure 6A:
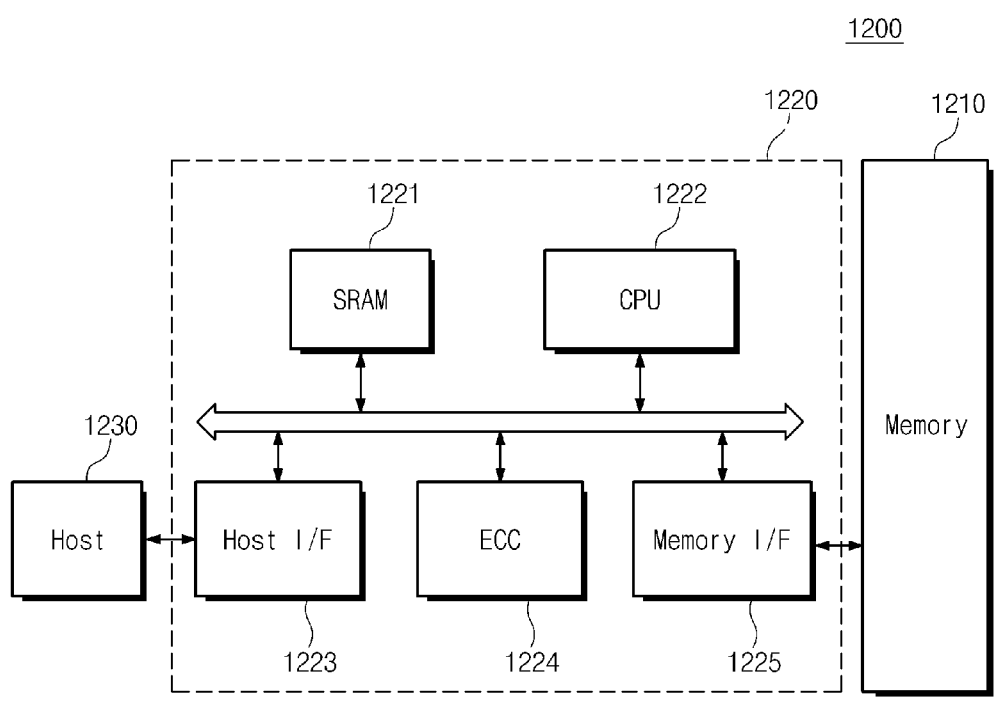
FIG. 6A is a schematic block diagram of a memory card including a semiconductor package according to example embodiments of the inventive concepts.
Figure 6B:
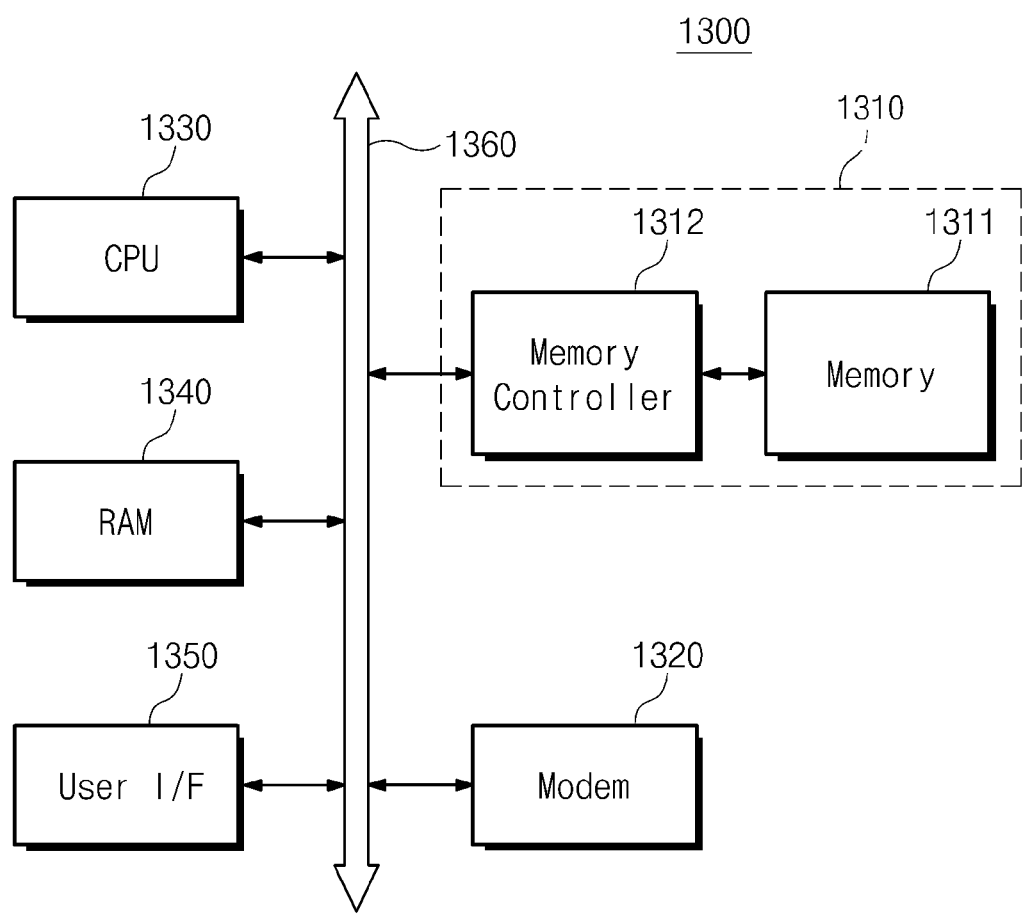
FIG. 6B is a schematic block diagram of an information processing system including a semiconductor package according to example embodiments of the inventive concepts.

FIG. 6A is a schematic block diagram illustrating a memory card including a semiconductor package according to example embodiments of the inventive concepts. FIG. 6B is a schematic block diagram illustrating an information processing system including a semiconductor package according to example embodiments of the inventive concepts.

Referring to FIG. 6A, a memory card 1200 may be realized using a memory device 1210 including one of the semiconductor packages according to exemplary embodiments of the inventive concepts, as described in connection with FIGS. 1A-1B, 2A-2F, 3A-3B, 4A-4E and 5A-5C. In some embodiments, the memory card 1200 may include a memory controller 1220 controlling general data exchanges between a host 1230 and the memory device 1210. A static random access memory (SRAM) 1221 may be used as an operating memory of a processing unit 1222. A host interface 1223 may include a data exchange protocol of the host 1230 connected to the memory card 1200. An error correction block 1224 may detect and correct errors included in data read from a multi-bit memory device 1210. A memory interface 1225 may interface with the memory device 1210. A processing unit 1222 may perform general control operations for data exchange of the memory controller 1220.

Referring to FIG. 6B, an information processing system 1300 may be provided using a memory system 1310 including one of the semiconductor packages according to example embodiments of the inventive concepts, as described in connection with FIGS. 1A-1B, 2A-2F, 3A-3B, 4A-4E and 5A-5C. For example, the information processing system 1300 may be a mobile device and/or a desktop computer. In some embodiments, the information processing system 1300 may further include a modem 1320, a central processing unit (CPU) 1330, a RAM 1340, and a user interface 1350, electrically connected to a system bus 1360. The memory system 1310 may include a memory device 1311 and a memory controller 1312 and is connected to the system bus 1360. In some embodiments, the memory system 1310 may be configured substantially identical to the memory system described with respect to FIG. 6A. Data processed by the CPU 1330 and/or input from the outside may be stored in the memory system 1310. In some embodiments, the memory system 1310 may be used as a portion of a solid state drive (SSD), and in this case, the information processing system 1300 may stably and reliably store a large amount of data in the memory system 1310. Although not illustrated, it is apparent to those skilled in the art that, for example, an application chipset, a Camera Image Sensor, a camera image signal processor (ISP), an input/output device, or the like may further be included in the information processing system 1300 according to the embodiments of the inventive concepts.

According to example embodiments of the inventive concepts, provided is a bilateral inner lead frame structure capable of supporting the semiconductor chip at both sides thereof. Due to the bilateral inner lead frame structure, it is possible to enhance stability in supporting the semiconductor chip and to prevent an inclination of the semiconductor chip. As a result, bondability in a wire-bonding process can be enhanced and it is possible to reduce a process failure, which may be caused from a quantitative imbalance of a supplied molding material.

While example embodiments of the inventive concepts have been particularly shown and described, it will be understood by one of ordinary skill in the art that variations in form and detail may be made therein without departing from the spirit and scope of the attached claims.

What is claimed is:

1. A semiconductor package, comprising:
a lead frame supporting a semiconductor chip and electrically connected to the semiconductor chip by bonding wires; and
a molding layer encapsulating the semiconductor chip,
wherein the lead frame comprises:
a plurality of first lead frames extending from a first side to a second side of the semiconductor chip to run across a bottom surface of the semiconductor chip and support the semiconductor chip, wherein the plurality of first lead frames extend from the first side of the semiconductor chip beyond a center portion of the semiconductor chip; and
a plurality of second lead frames extending from the second side to the first side of the semiconductor chip to run across the bottom surface of the semiconductor chip, wherein the plurality of second lead frames are spaced apart from the plurality of first lead frames.

2. The semiconductor package of claim 1, wherein the first lead frame comprises:
a first inner lead running across the bottom surface of the semiconductor chip and including a first end portion extending in a first direction beyond a boundary of the semiconductor chip; and
a first outer lead extending from the first inner lead in a second direction beyond the molding layer.

3. The semiconductor package of claim 2, wherein the second lead frame comprises:
a second inner lead extending from the second side to the first side of the semiconductor chip and supporting the bottom surface of the semiconductor chip, the second inner lead configured not to protrude beyond a boundary on the first side of the semiconductor chip; and
a second outer lead extending from the second inner lead in the first direction beyond the molding layer.

4. The semiconductor package of claim 3, wherein the semiconductor chip comprises a plurality of edge pads arranged on a top surface on the semiconductor chip on the second side,
the bonding wires are configured to electrically connect the first and second inner leads with the edge pads at the second side of the semiconductor chip, and
the bonding wires are connected to the first end portions of the first inner leads.

5. The semiconductor package of claim 2, wherein the second lead frame comprises:
a second inner lead running across the bottom surface of the semiconductor chip and including a second end portion extending in the second direction beyond a boundary of the semiconductor chip; and
a second outer lead extending in the first direction from the second inner lead beyond the molding layer.

6. The semiconductor package of claim 5, wherein the semiconductor chip comprises a plurality of first edge pads arranged on a top surface of the semiconductor chip on the first side and a plurality of second edge pads arranged on the top surface of the semiconductor chip on the second side, and
the bonding wires are configured to connect electrically the first inner leads with the first edge pads at the first side of the semiconductor chip and to connect electrically the second inner leads with the second edge pads at the second side of the semiconductor chip.

7. The semiconductor package of claim 5, wherein the semiconductor chip comprises a plurality of first edge pads arranged on a top surface of the semiconductor on the first side and a plurality of second edge pads arranged on the top surface of the semiconductor chip on the second side, and
the bonding wires are configured to connect electrically the second end portions of the second inner leads with the first edge pads at the first side of the semiconductor chip and to connect electrically the first end portions of the first inner leads with the second edge pads at the second side of the semiconductor chip.

8. The semiconductor package of claim 5, further comprising:
a plurality of third lead frames disposed adjacent to a boundary on the first side of the semiconductor chip and interposed between the first lead frames; and
a plurality of fourth lead frames disposed adjacent to a boundary on the second side of the semiconductor chip and interposed between the second lead frames.

9. The semiconductor package of claim 8, wherein the third lead frame comprises a third inner lead spaced apart from the second end portion of the second inner lead and a third outer lead extending from the third inner lead in the second direction beyond the molding layer, and
the fourth lead frame comprises a fourth inner lead spaced apart from the first end portion of the first inner lead and a fourth outer lead extending from the fourth inner lead in the first direction beyond the molding layer.

10. The semiconductor package of claim 9, wherein the semiconductor chip comprises a first edge pad disposed on a top surface of the semiconductor chip on the first side and second edge pads disposed on the top surface of the semiconductor chip on the second side, and
the bonding wires are configured to connect electrically the first and third inner leads with the first edge pads at the first side of the semiconductor chip and to connect electrically the second and fourth inner leads with the second edge pads at the second side of the semiconductor chip.

11. The semiconductor package of claim 1, further comprising:

a first fixing tape adhered on the first lead frames to fasten the first lead frames; and a second fixing tape adhered on the second lead frames to fasten the second lead frames, wherein the first fixing tape and the second fixing tape are spaced apart from the semiconductor chip.

12. The semiconductor package of claim 1, wherein each of the first and second lead frames comprises an incline surface or a flat surface, the incline surface being downhill sloped toward an inside of the molding layer.

13. A semiconductor package, comprising:

a semiconductor chip including a plurality of edge pads disposed on a top surface of the semiconductor chip on a first side thereof;

a molding layer encapsulating the semiconductor chip;

a plurality of first lead frames including first inner leads and first outer leads, each of the first inner leads extending from a second side to the first side of the semiconductor chip to run across a bottom surface of the semiconductor chip and including a first end portion protruding from a boundary on the first side of the semiconductor chip, and each of the first outer leads extending from the first inner lead at a second end portion opposite the first end portion in a first direction beyond the molding layer;

a plurality of second lead frames including second inner leads and second outer leads, each of the second inner leads extending from the first side to the second side of the semiconductor chip to run across and support the bottom surface of the semiconductor chip, and each of the second outer leads extending from the second inner lead in a second direction beyond the molding layer; and a plurality of bonding wires electrically connecting the first and second inner leads with the edge pads at the first side of the semiconductor chip, wherein the plurality of first lead frames extend from the first side of the semiconductor chip beyond a center portion of the semiconductor chip, wherein the plurality of second lead frames are spaced apart from the plurality of first lead frames.

14. The semiconductor package of claim 13, wherein the second inner lead is configured to extend from the first side to the second side of the semiconductor chip but not to protrude beyond a boundary on the second side of the semiconductor chip.

15. The semiconductor package of claim 13, wherein the second inner lead is configured to run across the bottom surface of the semiconductor chip and includes a second end portion protruding beyond a boundary on the second side of the semiconductor chip.

16. A semiconductor package, comprising:

a semiconductor chip having a first side and a second side;

a molding layer encapsulating the semiconductor chip;

a plurality of first lead frames extending from a bottom surface of the semiconductor chip in a first direction; and a plurality of second lead frames extending from the bottom surface of the semiconductor chip in a second direction opposite the first direction, wherein the plurality of first lead frames run across the bottom surface of the semiconductor chip to support the semiconductor chip on the first and second sides, and the plurality of second lead frames run across and support the bottom surface of the semiconductor chip on the second side, wherein the plurality of first lead frames extend from the first side of the semiconductor chip beyond a center portion of the semiconductor chip, wherein the plurality of second lead frames are spaced apart from the plurality of first lead frames.

17. The semiconductor package of claim 16, wherein the first lead frame comprises:

a first inner lead running across the bottom surface of the semiconductor chip; and a first outer lead extending from the first inner lead in the first direction beyond the molding layer.

18. The semiconductor package of claim 17, wherein the second lead frame comprises:

a second inner lead running across the bottom surface of the semiconductor chip; and a second outer lead extending from the second inner lead in the second direction beyond the molding layer.

19. The semiconductor package of claim 17, wherein the first inner lead comprises a first end portion extending in the second direction beyond a boundary of the semiconductor chip.

20. The semiconductor package of claim 19, wherein the second inner lead comprises a second end portion extending in the first direction beyond a boundary of the semiconductor chip.

* * * * *